(12) United States Patent
Lin et al.

(10) Patent No.: US 9,633,904 B1
(45) Date of Patent: Apr. 25, 2017

(54) METHOD FOR MANUFACTURING SEMICONDUCTOR DEVICE WITH EPITAXIAL STRUCTURE

(71) Applicant: UNITED MICROELECTRONICS CORP., Hsin-Chu (TW)

(72) Inventors: Yu-Ying Lin, Tainan (TW); Chueh-Yang Liu, Tainan (TW); Yu-Ren Wang, Tainan (TW); Neng-Hui Yang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/352,528

(22) Filed: Nov. 15, 2016

Related U.S. Application Data (62) Division of application No. 14/977,602, filed on Dec. 21, 2015, now Pat. No. 9,530,886.

(30) Foreign Application Priority Data

Nov. 27, 2015 (CN) .......................... 2015 1 0844852

(51) Int. Cl.
| | | |
|---|---|---|
| H01L 21/336 | (2006.01) | |
| H01L 21/8234 | (2006.01) | |
| H01L 21/265 | (2006.01) | |
| H01L 21/3065 | (2006.01) | |
| H01L 29/66 | (2006.01) | |
| H01L 21/306 | (2006.01) | |

(Continued)

(52) U.S. Cl.
CPC ................ H01L 21/823418 (2013.01); H01L 21/02636 (2013.01); H01L 21/26513 (2013.01); H01L 21/26586 (2013.01); H01L 21/3065 (2013.01); H01L 21/30604 (2013.01); H01L 29/0847 (2013.01); H01L 29/165 (2013.01); H01L 29/167 (2013.01); H01L 29/6656 (2013.01); H01L 29/66636 (2013.01); H01L 29/7848 (2013.01)

(58) Field of Classification Search
CPC ....... H01L 21/823418; H01L 21/02636; H01L 21/26513; H01L 21/26586; H01L 21/30604
See application file for complete search history.

(56) References Cited

U.S. PATENT DOCUMENTS

| | | | |
|---|---|---|---|
| 7,335,959 B2 | 2/2008 | Curello et al. | |
| 7,750,338 B2 * | 7/2010 | Wang | .................. H01L 29/6656 257/18 |

(Continued)

*Primary Examiner* — Bradley K Smith
(74) *Attorney, Agent, or Firm* — Winston Hsu; Scott Margo (57) ABSTRACT

A method for manufacturing a semiconductor device with epitaxial structure includes following steps: A substrate including a plurality of gate structures formed thereon is provided, and a spacer is respectively formed on sidewalls of each gate structure. Next, a first etching process is performed to form a first recess respectively at two sides of the gate structures and followed by performing an ion implantation to the first recesses. After the ion implantation, a second etching process is performed to widen the first recesses to form widened first recesses and to form a second recess respectively at a bottom of each widened first recess. Then, an epitaxial structure is respectively formed in the widened first recesses and the second recesses.

10 Claims, 5 Drawing Sheets

(51) Int. Cl.
*H01L 29/167* (2006.01)
*H01L 29/08* (2006.01)
*H01L 21/02* (2006.01)
*H01L 29/78* (2006.01)
*H01L 29/165* (2006.01)

(56) References Cited

U.S. PATENT DOCUMENTS

| | | |
|---|---|---|
| 8,193,065 B2 | 6/2012 | Johnson |
| 8,278,164 B2 | 10/2012 | Li |
| 8,604,564 B2 | 12/2013 | Li |
| 9,059,286 B2 | 6/2015 | Holt |
| 2013/0280878 A1* | 10/2013 | Wen .................... H01L 21/3105 438/299 |
| 2013/0328126 A1* | 12/2013 | Tsai .................. H01L 29/41783 257/368 |
| 2015/0364601 A1 | 12/2015 | Kuang |

* cited by examiner

METHOD FOR MANUFACTURING SEMICONDUCTOR DEVICE WITH EPITAXIAL STRUCTURE

CROSS REFERENCE TO RELATED APPLICATIONS

This application is a division of U.S. application Ser. No. 14/977,602 filed on Dec. 21, 2015, and incorporated herein by reference in its entirety.

BACKGROUND OF THE INVENTION

1. Field of the Invention

The present invention relates to a semiconductor device with epitaxial structure and manufacturing method thereof, and more particularly, to a semiconductor device with epitaxial structure for selective strain scheme (SSS) and manufacturing method thereof.

2. Description of the Prior Art

Epitaxial structures are prevalently used in a wide variety of semiconductor applications. For example, the prior art usually forms epitaxial structures in a single crystal substrate by performing a selective epitaxial growth (hereinafter abbreviated as SEG) method. Since the epitaxial structures have the crystalline orientation almost identical to the crystalline orientation of the substrate, the epitaxial structures serves as a raised source/drain or a recessed source/drain for the semiconductor device. Because the lattice constant of the epitaxial structures is larger than that of the silicon substrate, a strain stress is generated to the channel region of the meta-oxide semiconductor (hereinafter abbreviated as MOS) transistor device. Accordingly, carrier mobility in the channel region is improved and the speed of the MOS transistor device is increased. By rendering strain stress to improve the carrier mobility, the epitaxial structures therefore serve as one approach of the selective strain scheme (SSS).

Although the epitaxial structures efficiently improve device performance, it increase complexity of the semiconductor fabrication and difficulties of process control. Furthermore, stress from epitaxial source/drain is required of being directly and efficaciously pointed to the channel region. And thus it also increases design and fabrication difficulties.

Accordingly, though the epitaxial structure is able to improve the device performance, it is always in need to provide semiconductor devices as expected when the progress of semiconductor manufacturing technology is improved and complexity of the products is increased.

SUMMARY OF THE INVENTION

According to an aspect of the present invention, a method for manufacturing a semiconductor device with epitaxial structure is provided. The method includes following steps: A substrate including a plurality of gate structures formed thereon is provided, and a spacer is respectively formed on sidewalls of each gate structure. Next, a first etching process is performed to form a first recess respectively at two sides of the gate structures and followed by performing an ion implantation to the first recesses. After the ion implantation, a second etching process is performed to widen the first recesses to form widened first recesses and to form a second recess respectively at a bottom of each widened first recess. Then, an epitaxial structure is respectively formed in the widened first recesses and the second recesses.

According to an aspect of the present invention, a semiconductor device with epitaxial structure is provided. The semiconductor device with epitaxial structure includes a substrate including a first semiconductor material, a gate structure formed on the substrate, a spacer formed on sidewalls of the gate structure, and a plurality of hyper-sigma ($\Sigma$) shaped epitaxial stressors formed in the substrate respectively at two sides of the gate structure. The hyper-$\Sigma$ shaped epitaxial stressors respectively include the first semiconductor material and a second semiconductor material, and a lattice constant of the second semiconductor material is larger than a lattice constant of the first semiconductor material. The hyper-$\Sigma$ shaped epitaxial stressors further include a first portion, a second portion and a neck physically connecting the first portion and the second portion. The first portion includes a pair of first tip pointed toward the gate structure in a cross-sectional view, and the second portion includes a pair of second tips pointed toward the gate structure in the cross-sectional view. The neck includes a first slanted surface in the first portion and a second slanted surface in the second portion.

According to an aspect of the present invention, a semiconductor device with epitaxial structure is provided. The semiconductor device with epitaxial structure includes a substrate comprising a first semiconductor material, a gate structure formed on the substrate, a spacer formed on sidewalls of the gate structure, and a plurality of epitaxial stressors formed in the substrate respectively at two sides of the gate structure. The epitaxial stressors respectively include the first semiconductor material and a second semiconductor material, and a lattice constant of the second semiconductor material is larger than a lattice constant of the first semiconductor material. The epitaxial stressors further include a pair of first tips pointed toward the gate structure in a cross-sectional view and a pair of second tips formed under the first tips and pointed toward the gate structure in the cross-sectional view. A vertical distance between the first tips and a surface of the substrate, and a vertical distance between the second tips and the surface of the substrate are all smaller than 450 Å.

According to the semiconductor device with epitaxial structure provided by the present invention, the hyper-$\Sigma$ shaped epitaxial stressors including at least two pairs of tips are obtained by performing two etching processes and the intervening ion implantation. And the two pairs of tips are all pointed toward the gate structure and its channel region. More important, since the present invention provides at least two pairs of tips pointed toward the channel region, the stress obtained from the hyper-$\Sigma$ shaped epitaxial stressors is much larger than the prior art. Additionally, because vertical distances between the surface of the substrate and the tips are all smaller than 450 Å, the stresses can be correctly and efficaciously provided to the channel region of the semiconductor device in an effective spatial range. Briefly speaking, according to the semiconductor device with epitaxial structure provided by the present invention, the epitaxial stressors, which serve as the main stress providers, efficaciously render much more stresses to the channel region, and thus performance of the semiconductor device is improved greatly.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-7 are schematic drawings illustrating a method for manufacturing a semiconductor device with epitaxial structure provided by a preferred embodiment of the present invention, wherein

DETAILED DESCRIPTION

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have been described in detail in order to avoid obscuring the invention.

It will be understood that when an element is referred to as being "formed" on another element, it can be directly or indirectly, formed on the given element by growth, deposition, etch, attach, connect, or couple. And it will be understood that when an elements or a layer is referred to as being "on", "connected to", or "coupled to" another element or layer, it can be directly on, connected or coupled to the other element or layer or intervening elements or layers may be present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer and/or section from another. Thus, a first element, component, region, layer or section discussed below could be termed a second element, component, region, layer or section without departing from the teachings of the disclosure.

Spatially relative terms, such as "beneath", "below", "lower", "above", "upper", in on and the like, may be used herein for ease of description to describe one element or feature's relationship to another element(s) or feature(s) as illustrated in the figures. It will be understood that spatially relative terms are intended to encompass different orientations of the device in use or operation in addition to the orientations depicted in the figures. For example, if the device in the figures in turned over, elements described as "below" or "beneath" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to be limiting of the inventions. As used herein, the singular form "a", "an" and "the" are intended to include the plural forms as well, unless the context clearly indicates otherwise.

Figure 1:
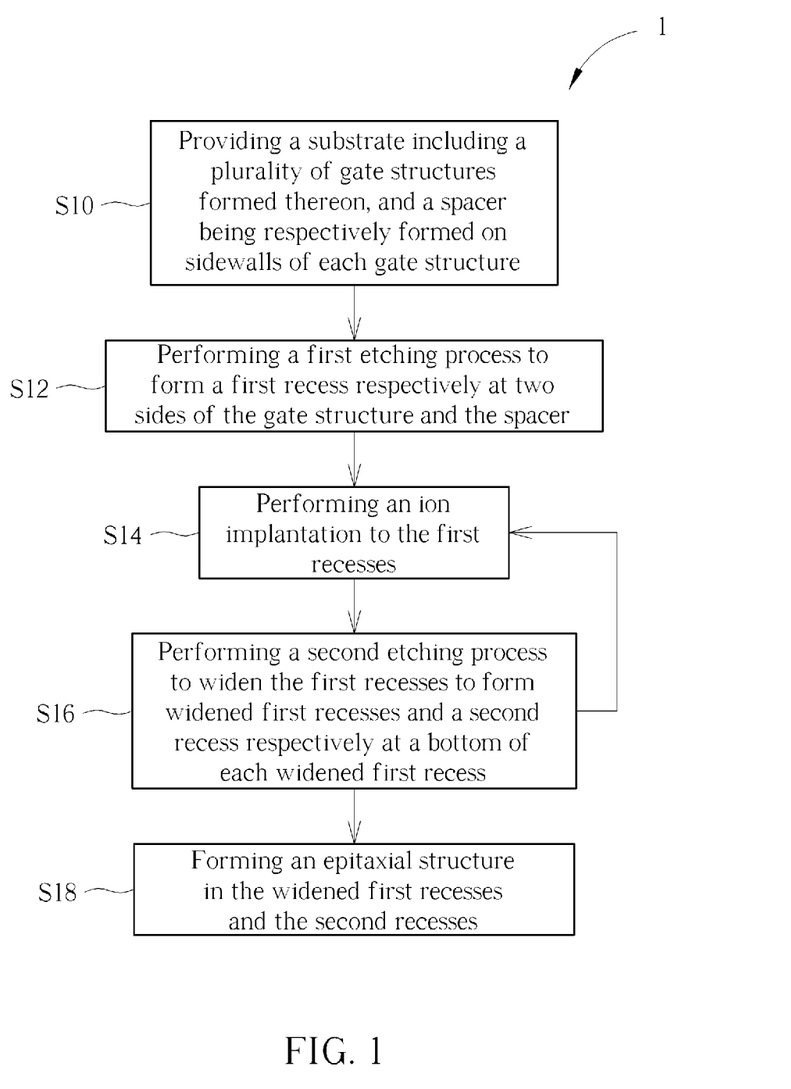
FIG. 1 is a flow chart illustrating the method for manufacturing a semiconductor device with epitaxial structure.
Figure 2:
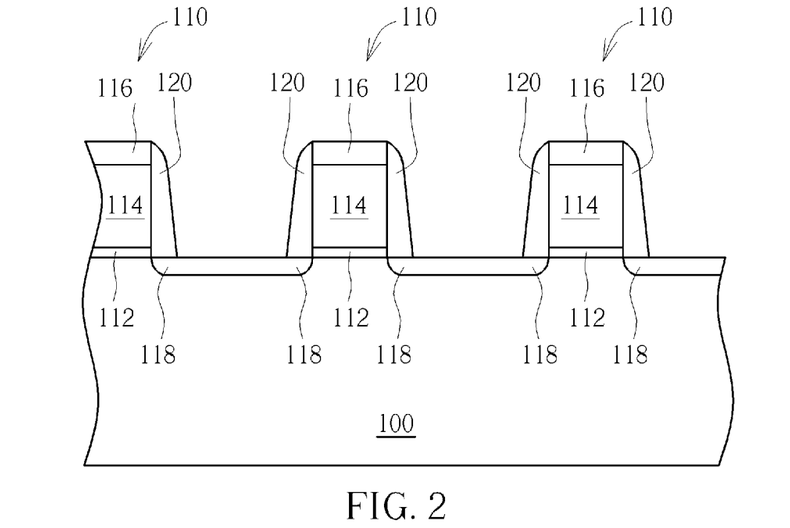
Figure 3:
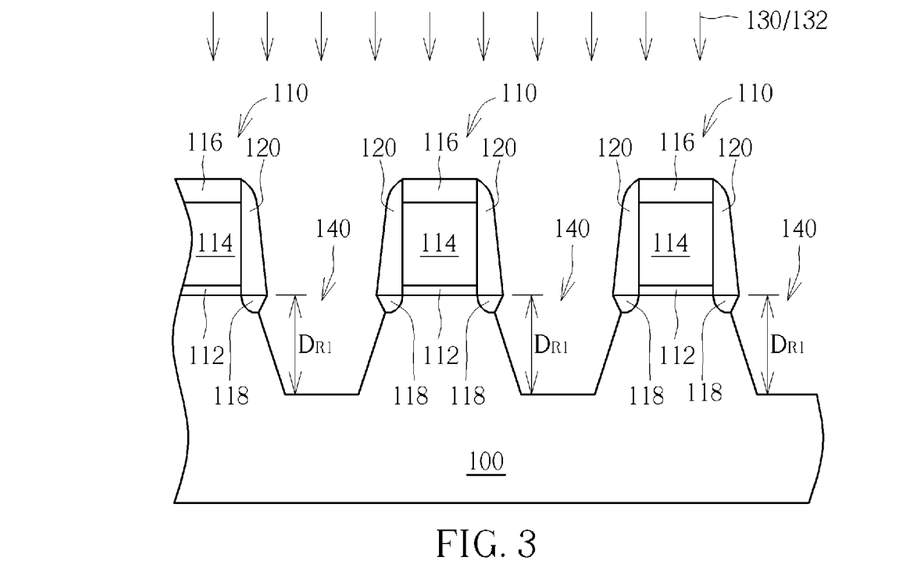
FIG. 3 is a schematic drawing in a step subsequent to FIG. 2.

Please refer to FIGS. 1-7, which are schematic drawings illustrating a method for manufacturing a semiconductor device with epitaxial structure provided by a preferred embodiment of the present invention, and FIG. 1 is a flow chart illustrating the method for manufacturing the semiconductor device with epitaxial structure while FIGS. 2-7 illustrating steps of the method for manufacturing the semiconductor device with epitaxial structure. Please refer to FIG. 1. According to the method for manufacturing a semiconductor device with epitaxial structure 1 provided by the preferred embodiment, STEP S10 is performed:

STEP S10: Providing a Substrate Including a Plurality of Gate Structures Formed Thereon, and a Spacer being Respectively Formed on Sidewalls of Each Gate Structure Please refer to FIG. 2. The preferred embodiment provides a substrate 100. The substrate 100 includes a first semiconductor material, and the first semiconductor material may be, for example but not limited to, silicon (Si), germanium (Ge), III-V compound, or II-VI compound. In some embodiments of the present invention, the first semiconductor material preferably includes Si, but not limited to this. Additionally, the semiconductor substrate 100 can be bulk Si substrate with (100) crystal plane in some embodiments of the present invention. A plurality of gate structures 110 are formed on the substrate 100. The gate structures 110 respectively include a gate dielectric layer 112, agate conductive layer 114 and a cap layer 116, sequentially and upwardly stacked on the substrate 100. It is well-known to those skilled in the art that the cap layer 116 is formed to cover the gate conductive layer 114 and to protect the gate conductive layer 114 from damage that may be caused in any process such as photolithograph process, ion implantation, etching process, or any needed cleaning process in the semiconductor fabricating process. Subsequently, ion implantation is performed to form lightly-doped drains (LDDs) 118 in the substrate 100 respectively at two sides of the gate structures 110 and followed by forming a spacer 120 on sidewalls of each gate structure 110. The spacer 120 preferably is a multi-layered structure. The spacers 120 formed on the sidewalls of the gate structures 110 are used to protect the sidewalls of the gate structure 120 and to define locations for forming a source/drain.

According to the method for manufacturing a semiconductor device with epitaxial structure 1 provided by the preferred embodiment, STEP S12 is subsequently performed:

STEP S12: Performing a First Etching Process to Form a First Recess Respectively at Two Sides of the Gate Structures and the Spacers Please refer to FIG. 3. Next, a first etching process 130/132 is performed to form a first recess 140 respectively at two sides of the gate structures 110, particularly next to the spacers 120. It is noteworthy that the first etching process 130/132 is a two-stepped etching process. In detail, the first etching process 130/132 sequentially includes a dry etching step 130 and a wet etching step 132, and the wet etching step 132 includes tetramethylammonium hydroxide (hereinafter abbreviated as TMAH). It should be noticed that a depth of the first recesses 140 is mainly defined by the dry etching step 130 of the first etching process 130/132. A depth etched by the dry etching step 130 is about 200 angstroms (Å), but not limited to this. It is also noteworthy that the wet etching step 132 of the first etching process 130/132 includes a higher etching rate to (111) crystal plane of the substrate 100, therefore the wet etching step 132 mainly renders lateral etching to the substrate 100. However, the wet etching step 132 still renders vertical etching to the substrate 100. A depth etched by the wet etching step 132 is about 120 Å, but not limited to this. Consequently, the first recesses 140 formed by performing the first etching process 130/132 include a depth $D_{R1}$, and the depth $D_{R1}$ is about 320 Å, but not limited to this.

According to the method for manufacturing a semiconductor device with epitaxial structure 1 provided by the preferred embodiment, STEP S14 is subsequently performed:

STEP S14: Performing an Ion Implantation to the First Recesses

Figure 4:
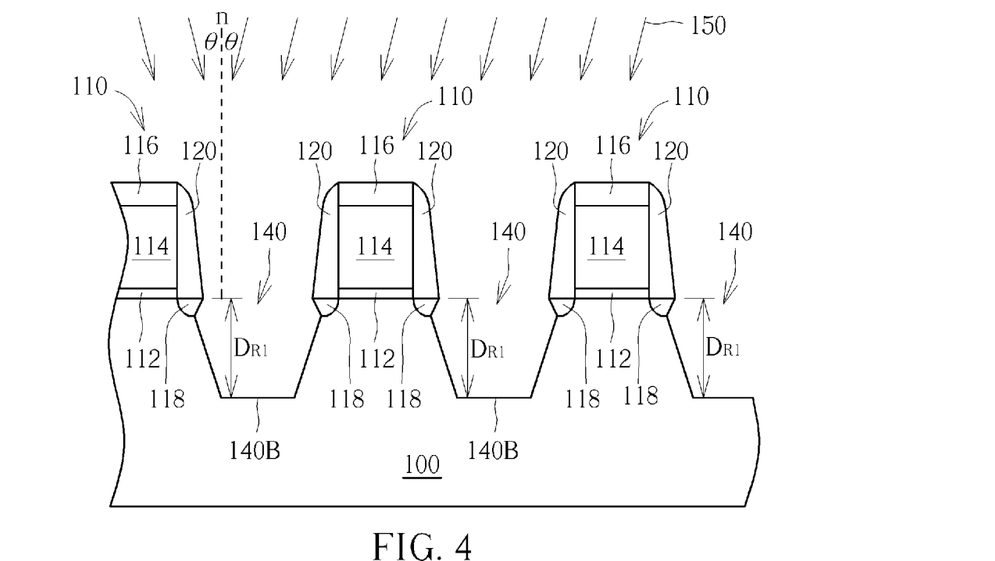
FIG. 4 is a schematic drawing in a step subsequent to FIG. 3.

Please refer to FIG. 4. After performing the first etching process 130/132, an ion implantation 150 is performed to the first recesses 140. The ion implantation 150 can include boron fluoride (BF), and a concentration of BF is about 2.5E14. Furthermore, the ion implantation 150 includes an incident angle θ away from a normal line to a surface 100S of the substrate 100, and the incident angle θ is about 25 degrees, but not limited to this.

Figure 5:
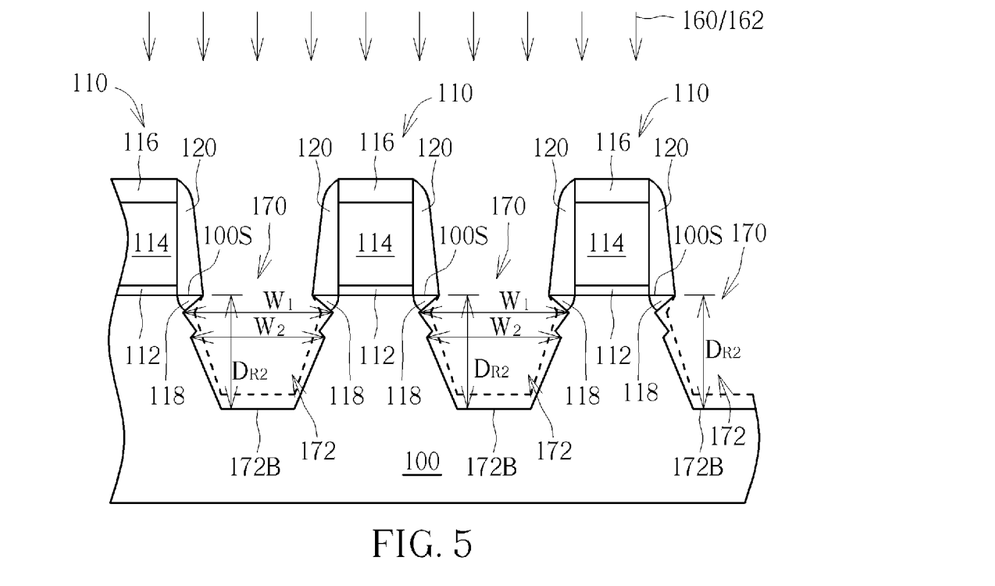
FIG. 5 is a schematic drawing in a step subsequent to FIG. 4.

According to the method for manufacturing a semiconductor device with epitaxial structure 1 provided by the preferred embodiment, STEP S16 is subsequently performed:

STEP S16: Performing a Second Etching Process to Widen the First Recesses to Form Widened First Recesses and a Second Recess Respectively at a Bottom of Each Widened First Recess Please refer to FIG. 5. After the ion implantation 150, a second etching process 160/162 is performed to widen the first recesses 140 to form widened first recesses 170 and to form a second recess 172 respectively at a bottom of each widened first recess 170. It is noteworthy that the second etching process 160/162 is also a two-stepped etching process. In detail, the second etching process 160/162 sequentially includes a dry etching step 160 and a wet etching step 162, and the wet etching step 162 also includes TMAH. It should be noticed that because BF is implanted into the first recesses 140 by the ion implantation 150, an etching rate of the material in the bottom of the first recesses 140 is altered. And thus, a depth etched by the dry etching step 160 of the second etching process 160/162 is decreased to 100 Å-150 Å, but not limited to this. Also, since the wet etching step 162 of the second etching process 160/162 includes a higher etching rate to (111) crystal plane of the substrate 100, the wet etching step 162 mainly renders lateral etching to the substrate 100. And thus the first recesses 140 are widened. However, the wet etching step 162 still renders vertical etching to the substrate 100: A depth etched by the wet etching step 162 is about 120 Å, but not limited to this. Consequently, as shown in FIG. 5, the widened first recesses 170 and the second recesses 172 formed at the bottoms of the widened first recesses 170 obtained by performing the second etching process 160/162 includes a depth $D_{R2}$, which is defined as a vertical distance between a bottom 172B of the second recesses 172 and the surface 100S of the substrate 100, and the depth $D_{R2}$ is smaller than 700 Å, for example but not limited to, the depth $D_{R2}$ can be 590 Å-650 Å. Furthermore, as shown in FIG. 5, the vertical distance (that is the depth $D_{R2}$) between the bottom 172B of the second recesses 172 and the surface 100S of the substrate 100 is larger than the vertical distance (that is the depth $D_{R1}$) between the bottom 140B of the first recesses 140 and the surface 100S of the substrate 100. It should be noted that for emphasizing the profile difference between the first recesses 140 and the widened first recesses 170/the second recesses 172, the first recesses 140 are depicted by the dotted line as shown in FIG. 5. As shown in FIG. 5, the depth $D_{R1}$ of first recesses 140, which is the depth being etched by the first etching process 130/132, is about 320 Å while the depth being etched by the second etching process 160/162 is about 200 Å-270 Å. In other words, the depth etched by the first etching process 130/132 is larger than the depth etched by the second etching process 160/162. It is also noteworthy that the widened first recesses 170 include a first widest width $W_1$, the second recesses 172 include a second widest width $W_2$, and the first widest width $W_1$ is larger than the second widest width $W_2$ as shown in FIG. 5.

According to the method for manufacturing a semiconductor device with epitaxial structure 1 provided by the preferred embodiment, STEP S18 is subsequently performed:

STEP S18: Forming an Epitaxial Structure in the Widened First Recesses and the Second Recesses.

Figure 6:
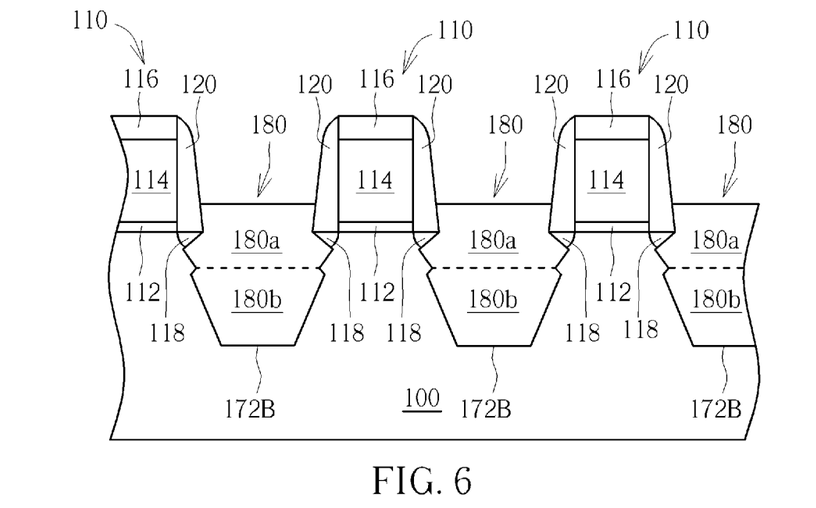
FIG. 6 is a schematic drawing in a step subsequent to FIG. 5.

Please refer to FIG. 6. Next, a SEG method is performed to respectively form an epitaxial layer 180 in the widened first recesses 170 and the second recesses 172. The widened first recesses 170 and the second recesses 172 are filled up with the epitaxial layer 180. It is well-known to those skilled in the art that the epitaxial material is always grown along the Si surface, and thus the epitaxial layer 180 is grown along surfaces of the recesses 170/172. Consequently, hyper-sigma (Σ) shaped epitaxial structures 180 as shown in FIG. 6 are obtained. Additionally, since the recesses 170/172 include flat bottoms 172B, the hyper-Σ shaped epitaxial structures 180 inherently obtain a flat bottom. The hyper-Σ shaped epitaxial structures 180 include the abovementioned first semiconductor material (Si) and a second semiconductor material, and a lattice constant of the second semiconductor material is different from a lattice constant of first semiconductor material. In some preferred embodiments of the present invention, the lattice constant of the second semiconductor material is preferably larger than the lattice constant of first semiconductor material. Additionally, the second semiconductor material in the hyper-Σ shaped epitaxial structures 180 can include materials suitable for transistor device of different conductivity types. For example, the second semiconductor material can be Ge in some preferred embodiments of the present invention, therefore the hyper-Σ shaped epitaxial structures 180 include SiGe. Since the lattice constant of the hyper-Σ shaped epitaxial structures 180 is larger than the lattice constant of the substrate 100, the hyper-Σ shaped epitaxial structures 180 serve as stressor. In other words, the preferred embodiment provides hyper-Σ shaped epitaxial stressors 180 respectively at the two sides of the gate structures 110 and the spacers 120.

Figure 7:
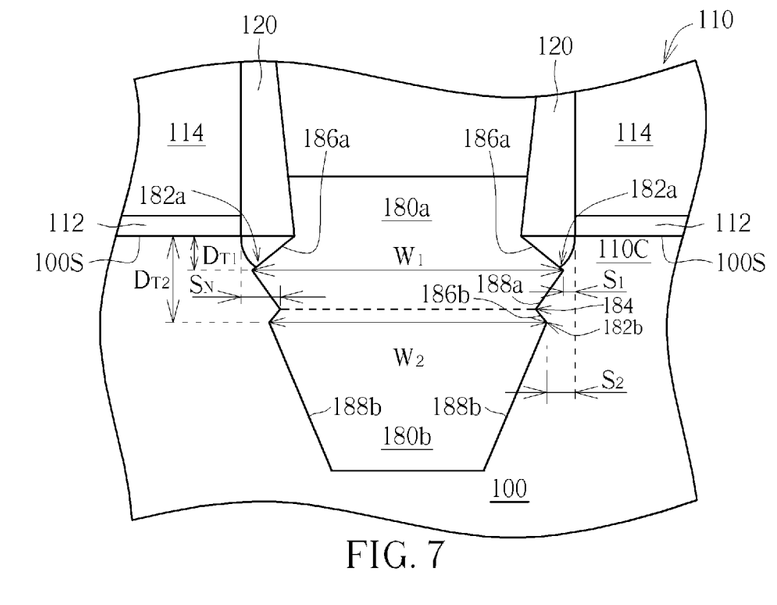
FIG. 7 is an enlarged view taken from FIG. 6.

Please refer to FIG. 7, which is an enlarged view taken from FIG. 6. As shown in FIG. 7, the hyper-Σ shaped epitaxial stressors 180 respectively include a first portion 180a and a second portion 180b formed under the first portion 180a. The first portion 180a can be formed to protrude from the surface 100S of the substrate 100. The first portion 180a includes a pair of first tips 182a, and the first tips 182a are pointed toward the gate structures 110 in a cross-sectional view. The second portion 180b includes a pair of second tips 182b and the second tips 182b are also pointed toward the gate structures 110 in the cross-sectional view. A distance between the first tips 182a is the abovementioned first widest width $W_1$ of the widened first recesses 170 while a distance between the second tips 182b is the abovementioned second widest width $W_2$ of the second recesses 172. Therefore, the distance $W_1$ between the first tips 182a is larger than the distance $W_2$ between the second tips 182b. More important, a vertical distance $D_{T1}$ between the first tips 182a and the surface 100S of the substrate 100, and a vertical distance $D_{T2}$ between the second tips 182b and the surface 100S of the substrate 100 are all smaller than 450 Å. As shown in FIG. 6 and FIG. 7, the hyper-Σ shaped epitaxial stressors 180 further include a neck 184 physically connecting the first portion 180a and the second portion 180b. In detail, the first portion 180a includes a first upper slanted surface 186a and a first lower slanted surface 188a while the second portion 180b includes a second upper slanted surface 186b and a second lower slanted surface 188b. As shown in FIG. 6 and FIG. 7, the neck 184 of the hyper-Σ shaped epitaxial stressor 180 includes the first lower slanted surface 188a of the first portion 180a and the second upper slanted surface 186b of the second portion 180b. In other words, the first lower slanted surface 188a of the first portion 180a and the second upper slanted surface 186b of the second portion 180b are connected at the neck 184. In a preferred embodiment of the present invention, a horizontal distance $S_N$ between the neck 184 and the gate structure 110 is smaller than 140 Å, but not limited to this.

Please still refer to FIG. 6 and FIG. 7. The second semiconductor material in the epitaxial layers 180 includes a concentration (that is the Ge concentration), and the concentration can be upwardly increased or graded from 0% to larger than 50% in some embodiments of the present invention. It is noteworthy that a concentration of the second semiconductor material in the first tips 182a and the second tips 182b is larger than 50%. It is often observed that dislocation defect occurs in epitaxial structures when the concentration of the second semiconductor material is larger than 38%, and the dislocation defect lowers stress rendered from the epitaxial structure. However, according to the preferred embodiment, the second semiconductor material is grown from both the flat bottoms and slanted surfaces of the recesses 170/172, and thus no dislocation defect will occur in the hyper-Σ shaped epitaxial stressors 180 even though the concentration of the semiconductor material in the hyper-Σ shaped epitaxial stressors 180 is larger than 50%. Briefly speaking, the hyper-Σ shaped epitaxial stressors 180 provided by the preferred embodiment include a superior growth result and are able to provide sufficient stress as expected.

Please still refer to FIG. 7. According to the preferred embodiment, a horizontal distance $S_1$ between the gate structure 110 and the first tips 182a of the hyper-Σ shaped epitaxial stressor 180, which is vertically closest to channel region 110C of the gate structures 110, is about 50 Å-75 Å. Consequently, the stress rendered from the hyper-Σ shaped epitaxial stressor 180 can be efficaciously exerted on channel region 110C of the device. However, the horizontal distance $S_1$ between the first tips 182a and the gate structure 110 can be modified by adjusting parameters of the abovementioned wet etching step 132/162. Therefore the horizontal distance $S_1$ between the first tips 182a and the gate structure 110 is not limited to this. Additionally, in some embodiments of the present invention, a horizontal distance $S_2$ between the gate structure 110 and the second tips 182b of the hyper-Σ shaped epitaxial stressor 180 can be 150 Å, but not limited to this. Since the hyper-Σ shaped epitaxial stressors 180 provided by the preferred embodiment include at least two pairs of tips 182a/182b and the two pairs of tips 182a/182b are all pointed to the channel regions 110C, the hyper-Σ shaped epitaxial stressors 180 provide much more stress than the prior art. Additionally, since the depth $D_{T1}/D_{T2}$ of the tips 182a/182b are all smaller than 450 Å, the hyper-Σ shaped epitaxial stressors 180 can efficaciously exert stress to the channel regions 110C of the semiconductor device in an effective spatial range.

Figure 8:
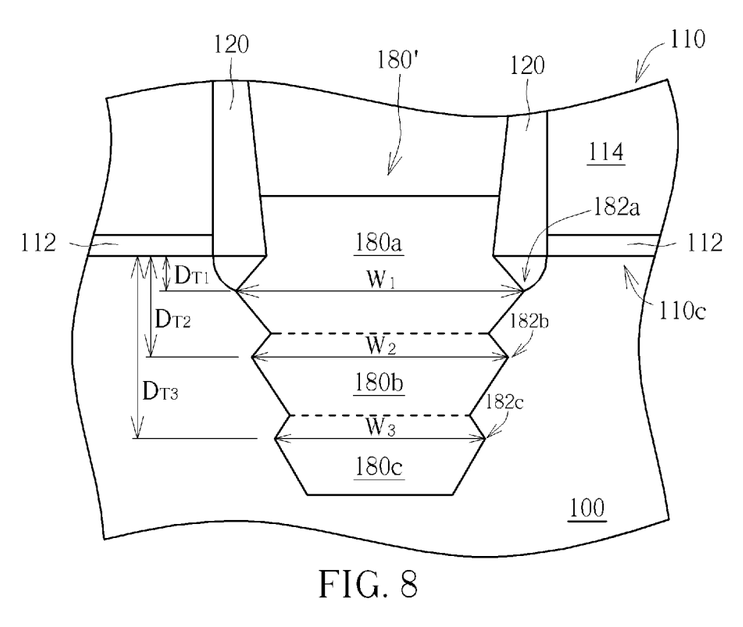
FIG. 8 is a schematic drawing illustrating a modification to the preferred embodiment.

Please refer to FIG. 1 and FIG. 8, wherein FIG. 8 is a schematic drawing illustrating a modification to the preferred embodiment. According to the modification, STEP S14 and STEP S16 of the method for manufacturing a semiconductor device with epitaxial structure 1 can be repeatedly performed. In other words, the ion implantation 150 and the second etching process 160/162 can be repeatedly performed after the first etching process 130/132 if required. For example, the ion implantation 150 and the second etching process 160/162 can be repeatedly once according to the modification, and thus the widened first recesses are further widened while the second recesses are also widened, and a third recess (not shown) is respectively formed at a bottom of each widened second recess. It is noteworthy that a permitted vertical distance (that is a permitted depth) between the surface 100S of the substrate 100 and a widest portion of the third recesses is to be smaller than 450 Å. For ensuring the given requirement is complied, parameters of the dry etching step 130 of the first etching process 130/132 and parameters of the dry etching step 160 of the second etching process 160/162, which both renders more impacts to the depth of the recesses, can be adjusted. For example but not limited to, process durations of the dry etching step 130 and the dry etching step 160 can be reduced, such that the final depth of the recesses will not exceed the permitted depth.

Please still refer to FIG. 8. According to the modification, a SEG method is performed after sequentially performing the first etching process 130/132, the ion implantation 150, the second etching process 160/162, the ion implantation 150 again, and the second etching process 160/162 again. Thus a hyper-Σ shaped epitaxial stressor 180' is respectively formed in the recesses. As shown in FIG. 8, the hyper-Σ shaped epitaxial stressor 180' includes a first portion 180a, a second portion 180b, and a third portion 180c. The third portion 180c is formed at the lowest portion while the second portion 180b is sandwiched in between the first portion 180a and the third portion 180c. As mentioned above, the first portion 180a can be formed to protrude from the surface 100S of the substrate 100. The first portion 180a includes a pair of first tips 182a pointed toward the gate structures 110 in a cross-sectional view, the second portion 180b includes a pair of second tips 182b pointed toward the gate structures 110 in the cross-sectional view, and the third portion 180c includes a pair of third tips 182c pointed toward the gate structures 110 in the cross-sectional view. As shown in FIG. 8, a distance $W_1$ between the first tips 182a is larger than a distance $W_2$ between the second tips 182b, and the distance $W_2$ between the second tips 182b is larger than a distance $W_3$ between the third tips 182c. More important, a vertical distance $D_{T1}$ between the surface 100S of the substrate 100 and the first tips 182a, a vertical distance $D_{T2}$ between the surface 100S of the substrate 100 and the second tips 182b, and a vertical distance $D_{T3}$ between the surface 100S of the substrate 100 and the third tips 182c are all smaller than 450 Å. Since the hyper-Σ shaped epitaxial stressor 180' includes more tips 182a/182b/182c, which are pointed toward the gate structures 110, it renders more stresses to the channel regions 110C. Furthermore, since the depth $D_{T1}/D_{T2}/D_{T3}$ of the tips 182a/182b/182c are all smaller than 450 Å, the hyper-Σ shaped epitaxial stressor 180' can efficaciously exert stress on the channel regions 110C of the semiconductor devices in an effective spatial range.

According to the semiconductor device with epitaxial structure provided by the present invention, the epitaxial structures (that is the hyper-Σ shaped epitaxial stressor) including at least two pairs of tips are obtained by performing two etching processes and the intervening ion implantation. And the two pairs of tips are all pointed toward the gate structure and its channel region. More important, since the present invention provides at least two pairs of tips pointed toward the channel region, the stress obtained from the hyper-Σ shaped epitaxial stressor is much larger than the prior art. Additionally, because vertical distances between the surface of the substrate and the tips are all smaller than 450 Å, the stresses can be correctly and efficaciously provided to the channel region of the semiconductor device in an effective spatial range. Briefly speaking, according to the semiconductor device with epitaxial structure provided by the present invention, the epitaxial structure, which serves as the main stress provider, efficaciously renders much more stresses to the channel region, and thus performance of the semiconductor device is improved greatly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing a semiconductor device with epitaxial structure, comprising:
    providing a substrate comprising a plurality of gate structures formed thereon, and a spacer being respectively formed on sidewalls of each gate structure;
    performing a first etching process to forma first recess respectively at two sides of the gate structures;
    performing an ion implantation to the first recesses after the first etching process;
    performing a second etching process after the ion implantation to widen the first recesses to form widened first recesses and to form a second recess respectively at a bottom of each widened first recess; and
    forming an epitaxial structure respectively in the widened first recesses and the second recesses.

2. The method for manufacturing the semiconductor device with epitaxial structure according to claim 1, wherein a depth etched by the first etching process is larger than a depth etched by the second etching process.

3. The method for manufacturing the semiconductor device with epitaxial structure according to claim 1, wherein the first etching process and the second etching process respectively comprise a dry etching step and a wet etching step.

4. The method for manufacturing the semiconductor device with epitaxial structure according to claim 3, wherein the wet etching step comprises tetramethylammonium hydroxide (TMAH).

5. The method for manufacturing the semiconductor device with epitaxial structure according to claim 1, wherein the ion implantation comprises boron fluoride (BF).

6. The method for manufacturing the semiconductor device with epitaxial structure according to claim 1, wherein the ion implantation comprises an incident angle away from a normal line to a surface of the substrate, and the incident angle is about 25 degrees.

7. The method for manufacturing the semiconductor device with epitaxial structure according to claim 1, wherein the ion implantation and the second etching process are repeatedly performed after the first etching process.

8. The method for manufacturing the semiconductor device with epitaxial structure according to claim 1, wherein a vertical distance between a bottom of the second recesses and a surface of the substrate is larger than a vertical distance between a bottom of the first recesses and the surface of the substrate.

9. The method for manufacturing the semiconductor device with epitaxial structure according to claim 8, wherein the vertical distance between the bottom of the second recesses and the surface of the substrate is smaller than 700 angstroms (Å).

10. The method for manufacturing the semiconductor device with epitaxial structure according to claim 1, wherein the widened first recesses comprise a first widest width, the second recesses comprise a second widest width, and the first widest width is larger than the second widest width.

* * * * *